United States Patent
Lee

(10) Patent No.: US 8,330,514 B2
(45) Date of Patent: Dec. 11, 2012

(54) ONE-SHOT CIRCUIT CAPABLE OF BEING INTEGRATED INTO A CHIP, TRANSMITTER CAPABLE OF REDUCING START-UP TIME, AND RELATED METHOD

(75) Inventor: Wen-Jan Lee, Hsinchu (TW)

(73) Assignee: Princeton Technology Corporation, Xindian Dist., New Taipei (TW)

( * ) Notice: Subject to any disclaimer, the term of this patent is extended or adjusted under 35 U.S.C. 154(b) by 116 days.

(21) Appl. No.: 13/102,063

(22) Filed: May 6, 2011

(65) Prior Publication Data

US 2011/0273209 A1   Nov. 10, 2011

(30) Foreign Application Priority Data

May 6, 2010   (TW) .................................. 099114506

(51) Int. Cl.
*H03L 7/06* (2006.01)

(52) U.S. Cl. ........................ 327/158; 327/149

(58) Field of Classification Search .................. 327/149, 327/158

See application file for complete search history.

(56) References Cited

U.S. PATENT DOCUMENTS

| | | | |
|---|---|---|---|
| 3,825,696 A * | 7/1974 | Long | 700/174 |
| 5,440,636 A * | 8/1995 | Herrick | 380/34 |
| 5,751,655 A * | 5/1998 | Yamazaki et al. | 365/233.14 |
| 6,078,165 A * | 6/2000 | Ashtiani et al. | 320/116 |
| 2003/0090954 A1 * | 5/2003 | Takahashi et al. | 365/233.5 |
| 2011/0273209 A1 * | 11/2011 | Lee | 327/158 |

* cited by examiner

*Primary Examiner* — Adam Houston

(74) *Attorney, Agent, or Firm* — Winston Hsu; Scott Margo

(57) ABSTRACT

A one-shot circuit capable of being integrated into a chip generates a frequency-dividing signal according to a reference clock signal of a clock signal generator by means of a frequency-dividing circuit. In this way, the order of the magnitude of the cycle length of the frequency-dividing signal can be raised up by increasing the frequency-dividing times in the frequency-dividing circuit, so that the resistance and the capacitance of an RC oscillator of the clock signal generator are effectively reduced. Therefore, the circuited area occupied by the RC oscillator of the clock signal generator is reduced, so that the one shot circuit can be integrated into a chip without increasing the cost.

18 Claims, 8 Drawing Sheets

ONE-SHOT CIRCUIT CAPABLE OF BEING INTEGRATED INTO A CHIP, TRANSMITTER CAPABLE OF REDUCING START-UP TIME, AND RELATED METHOD

BACKGROUND OF THE INVENTION

1. Field of the Invention

The present invention is related to a one-shot circuit, and more particularly, to a one-shot circuit capable of being integrated into a chip.

2. Description of the Prior Art

Please refer to FIG. 1. A one-shot circuit generates a delay signal $S_{DELAY}$ according to an input signal $S_{IN}$. When the one-shot circuit receives the input signal representing "enabling", the delay signal $S_{DELAY}$ generated by the one-shot circuit represents "enabling"; and when the input signal $S_{IN}$ changes from representing "enabling" to "not enabling", the delay signal $S_{DELAY}$ generated by the one-shot circuit continues to represent "enabling" for a delay period $T_{DELAY}$. In the one-shot circuit, a clock signal generator is required for generating a reference clock signal so as to control the period length of the delay period $T_{DELAY}$. Generally speaking, the clock signal generator of the one-shot circuit is realized by a phase-shifting circuit (also referred to as an RC oscillator). However, when the required period length of the delay period $T_{DELAY}$ is longer, resistance and capacitance of the RC oscillator of the one-shot circuit are required to be larger. In other words, when the one-shot circuit is integrated into a chip, the RC oscillator of the one-shot circuit occupies such a large area in the chip that the cost of the chip vastly increases. Therefore, in the prior art, both the capacitor and the resistor of the RC oscillator of the one-shot circuit are external to the chip. However, it is inconvenient for the user to place the additional capacitor and resistor on the printed circuit board.

SUMMARY OF THE INVENTION

The present invention provides a one-shot circuit capable of being integrated into a chip. The one-shot circuit comprises a clock signal generator, a frequency-dividing circuit, and a counter. The clock signal generator is utilized for generating a reference clock signal according to an output signal. When the output signal represents enabling, the clock signal generator generates the reference clock signal. The frequency-dividing circuit is utilized for generating a frequency-dividing signal according to the reference clock signal. The counter is utilized for accumulating a counting value according to an input signal and the frequency-dividing signal, and comparing the counting value with a threshold signal so as to generate the output signal.

The present invention provides a transmitter for reducing start-up time, which transmits an amplified signal according to an input signal. The transmitter comprises a phase-locked loop circuit, a power amplifier, and a one-shot circuit. The phase-locked loop circuit is for generating a reference frequency signal according to a delay signal. When the delay signal represents enabling, the phase-locked loop circuit generates the reference frequency signal. The power amplifier is for generating the amplified signal according to the input signal and the reference frequency signal. The one-shot circuit is for generating the delay signal according to the input signal. When the input signal changes from representing enabling to not enabling, the delay signal generated by the one-shot circuit continues to represent enabling for a delay period, so that the phase-locked loop circuit continues to generate the reference frequency signal in the delay period.

The present invention provides a method of saving start-up time of a transmitter. The transmitter is utilized for transmitting an amplified signal according to an input signal. The transmitter has a phase-locked loop and a power amplifier. The phase-locked loop circuit is utilized for generating a reference frequency signal. The power amplifier is utilized for generating the amplified signal according to the input signal and the reference frequency signal. The method comprises providing a one-shot circuit, generating a delay signal by the one-shot circuit according to the input signal, and controlling the phase-locked loop circuit to generate the reference frequency signal according to the delay signal.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
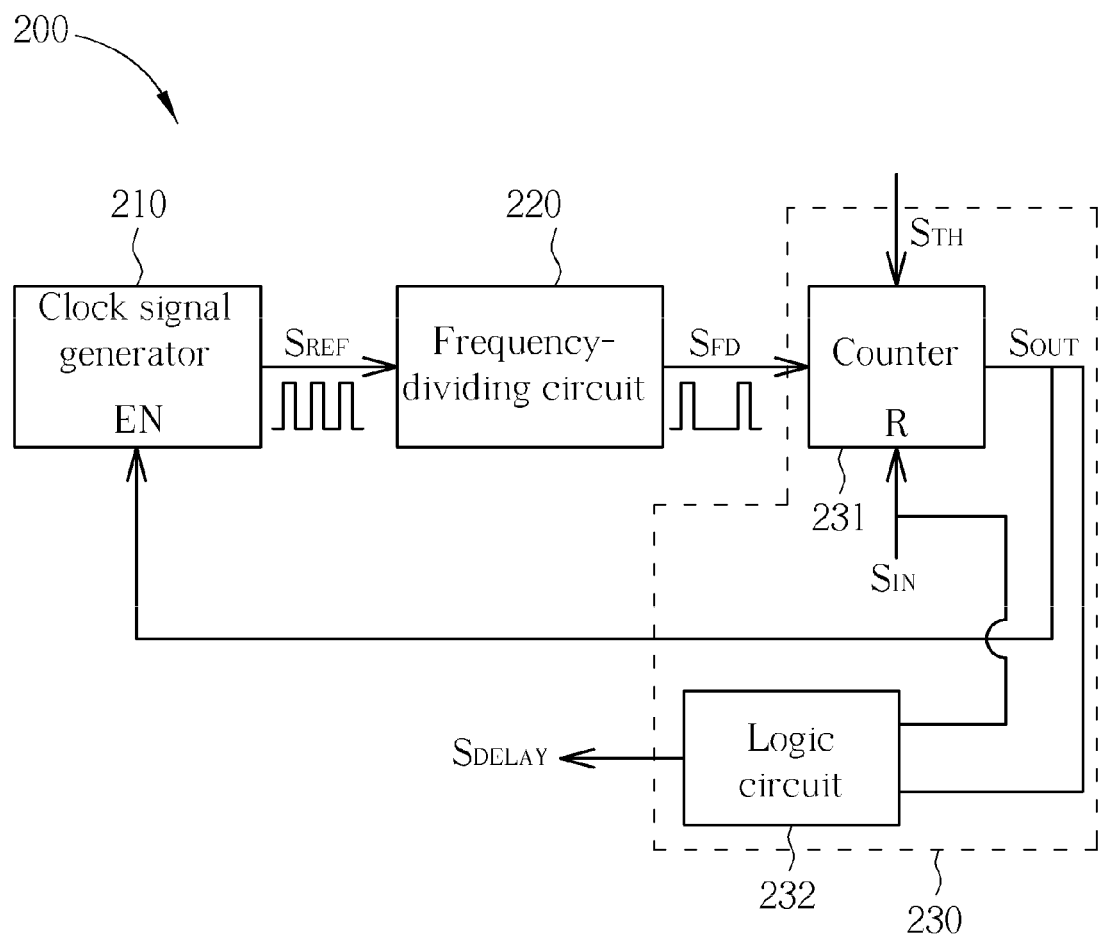
FIG. 2 is a diagram illustrating a one-shot circuit according to an embodiment of the present invention.

Please refer to FIG. 2. FIG. 2 is a diagram illustrating a one-shot circuit 200 capable of being integrated into a chip according to an embodiment of the present invention. The one-shot circuit 200 includes a clock signal generator 210, a frequency-dividing circuit 220, and a counting circuit 230. The clock signal generator 210 generates a reference clock signal $S_{REF}$ according to an output signal $S_{OUT}$. More particularly, the enabling end EN of the clock signal generator 210 receives the output signal $S_{OUT}$. Thus, when the output signal $S_{OUT}$ represents "enabling", the clock signal generator 210 generates the reference clock signal $S_{REF}$. The frequency-dividing circuit 220 generates a frequency-dividing signal $S_{FD}$ according to the reference clock signal $S_{REF}$. The cycle length of the frequency-dividing signal $S_{FD}$ is X times as long as that of the reference clock signal $S_{REF}$. The counting circuit 230 includes a counter 231, and a logic circuit 232. The counter 231 accumulates a counting value $N_C$, and the counter 231 compares the counting value $N_C$ with a threshold signal $S_{TH}$ so as to generate the output signal $S_{OUT}$. When the input signal $S_{IN}$ changes from representing "enabling" to "not enabling", the input signal $S_{IN}$ is transmitted to the reset end R of the counter 231. Meanwhile, the input signal $S_{IN}$ triggers the counter 231 to reset the counting value $N_C$ to be a predetermined value $N_{PRE1}$ (such as zero) and to accumulate the counting value $N_C$ according to the frequency-dividing signal $S_{FD}$. For instance, every time the counter 231 receives the frequency-dividing signal $S_{FD}$, the counter 231 increases the counting value $N_C$ by a predetermined value $N_{PRE2}$ (for example, $N_{PRE2}$ equals one). When the counting value $N_C$ is less than the threshold signal $S_{TH}$, the counter 231 generates the output signal $S_{OUT}$ representing "enabling"; and when the counting value $N_C$ is greater than or equal to the threshold signal $S_{TH}$, the counter 231 generates the output signal $S_{OUT}$ representing "not enabling". The logic circuit 232 receives the input signal $S_{IN}$ and the output signal $S_{OUT}$ so as to generate a delay signal $S_{DELAY}$. More particularly, when the input signal $S_{IN}$ represents "enabling" or the output signal $S_{OUT}$ represents "enabling", the delay signal $S_{DELAY}$ represents "enabling". When the input signal $S_{IN}$ and the output signal $S_{OUT}$ both represent "not enabling", the delay signal $S_{DELAY}$ represents "not enabling". The operation principle of the one-shot circuit 200 is further illustrated in the following description.

Figure 1:
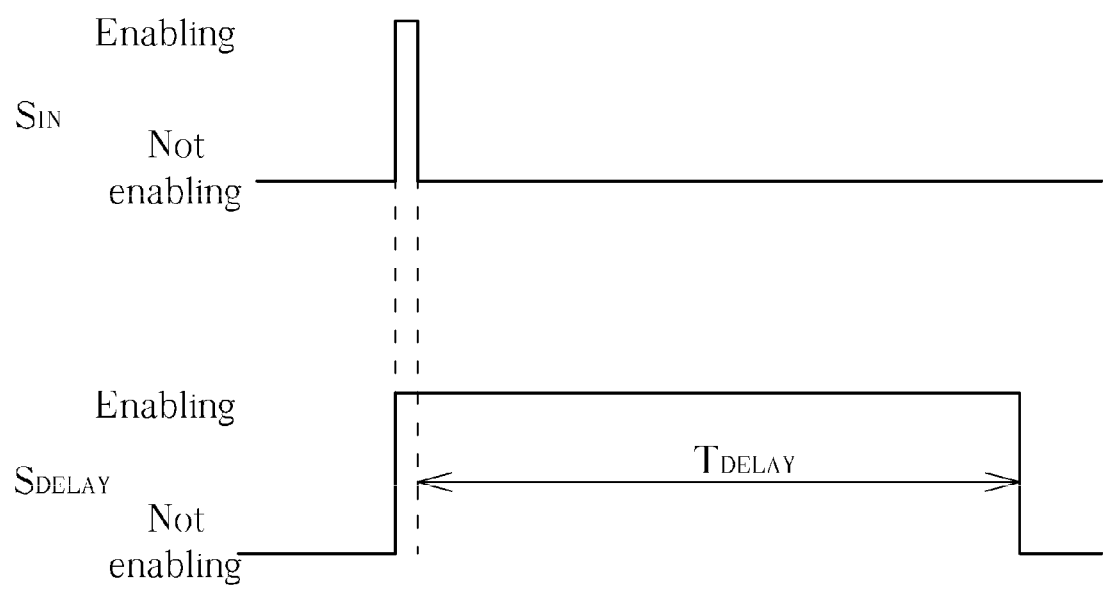
FIG. 1 is a diagram illustrating the waveform of the delay signal generated by a conventional one-shot circuit.
Figure 3:
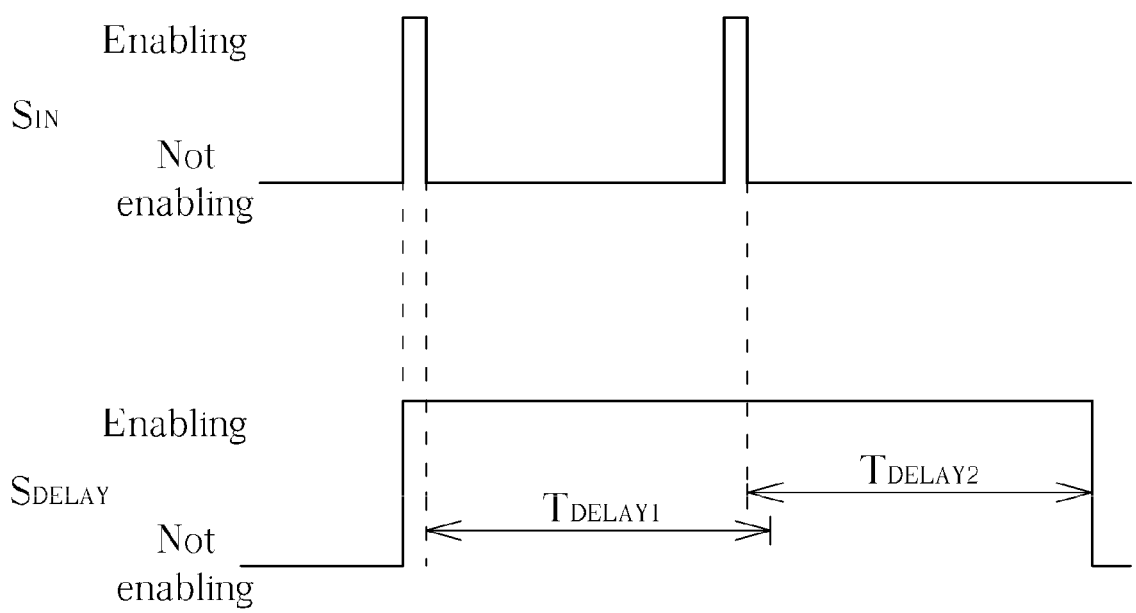
FIG. 3 is a diagram illustrating the input signal triggering the one-shot circuit of the present invention again in the delay period.

The waveform of the delay signal $S_{DELAY}$ generated by the one-shot circuit 200 is similar to the waveform shown in FIG. 1. When the input signal $S_{IN}$ represents "enabling", the logic circuit 232 of the one-shot circuit 200 generates the delay signal $S_{DELAY}$ representing "enabling". When the input signal $S_{IN}$ changes from representing "enabling" to "not enabling", the logic of the delay signal $S_{DELAY}$ generated by the logic circuit 232 is determined by the output signal $S_{OUT}$ of the counter 231. When the input signal $S_{IN}$ changes from representing "enabling" to "not enabling", the input signal $S_{IN}$ triggers the counter 231 to reset the counting value $N_C$ to be the predetermined value $N_{PRE1}$ (such as zero) and accumulate the counting value $N_C$ according to the frequency-dividing signal $S_{FD}$. Meanwhile, since the counting value $N_C$ is less than the threshold signal $S_{TH}$, the output signal $S_{OUT}$ generated by the counter 231 represents "enabling". In this way, the delay signal $S_{DELAY}$ generated by the logic circuit 232 also represents "enabling". After a delay period $T_{DELAY}$, the counter 231 accumulates counting value $N_C$ up to the threshold signal $S_{TH}$. Hence, the output signal $S_{OUT}$ generated by the counter 231 changes to represent "not enabling". As a result, the delay signal $S_{DELAY}$ generated by the logic circuit 232 also changes to represent "not enabling". That is, when the one-shot circuit 200 receives the input signal $S_{IN}$ representing "enabling", the delay signal $S_{DELAY}$ generated by the one-shot circuit 200 represents "enabling"; and when the input signal $S_{IN}$ changes from representing "enabling" to "not enabling", the delay signal $S_{DELAY}$ generated by the one-shot circuit 200 still keeps representing "enabling" for a delay period $T_{DELAY}$. In addition, after the input signal $S_{IN}$ changes from representing "enabling" to "not enabling", if in the delay period $T_{DELAY1}$, the one-shot circuit 200 receives the input signal $S_{IN}$ representing "enabling" again (as shown in FIG. 3), since the input signal $S_{IN}$ changes from "enabling" to "not enabling" again, the counter 231 is triggered to reset the counting value $N_C$ again. Therefore, another delay period $T_{DELAY2}$ is required (the period length of the delay periods $T_{DELAY1}$ and $T_{DELAY2}$ is equal to that of $T_{DELAY}$) for the counter 231 accumulating the counting value $N_C$ up to the threshold signal $S_{TH}$, so as to urge the delay signal $S_{DELAY}$ to change from representing "enabling" to "not enabling". In other words, if the one-shot circuit 200 receives the input signal $S_{IN}$ representing "enabling" in the delay period $T_{DELAY1}$, the input signal $S_{IN}$ triggers the one-shot circuit 200 again, so that the counting value $N_C$ of the counter 232 is reset and re-accumulated from the predetermined value $N_{PRE1}$. In this way, the delay signal $S_{DELAY}$ generated by the one-shot circuit 200 keeps representing "enabling" for another delay period $T_{DELAY2}$.

In addition, provided that every time the counter 231 receives the frequency-dividing signal $S_{FD}$, the counter 231 increases the counting value $N_C$ by one, and the cycle length of the frequency-dividing signal $S_{FD}$ is $2^N$ times as long as that of the reference clock signal $S_{REF}$, the required period (the delay period $T_{DELAY}$) of the counter 231 accumulating the counting value $N_C$ up to the threshold signal $S_{TH}$ can be represented by the following formula:

$$T_{DELAY} = 2^N \times T_{REF} \times S_{TH} \quad (1);$$

$T_{REF}$ represents the cycle length of the reference clock signal $S_{REF}$. It can be seen according to the formula (1) that compared with the conventional one-shot circuit, the one-shot circuit 200 of the present invention can increase the order of the magnitude of the delay period $T_{DELAY}$ by increasing the number N. In other words, as long as the frequency-dividing times (N) of the frequency-dividing circuit 220 increases, the cycle length of the reference clock signal $S_{REF}$ can be reduced. In this way, when the RC oscillator is used for realizing the clock signal generator 210, the required resistance and capacitance of the RC oscillator are effectively lowered. In other words, the one-shot circuit 200 can effectively reduce the circuit area in the chip occupied by the RC oscillator of the one-shot circuit 200 by increasing the frequency-dividing times (N) of the frequency-dividing circuit 220. Hence, the one-shot circuit 200 of the present invention can be integrated into a chip. In addition, it can be seen according to the formula (1) that the user can adjust the period length of the delay period $T_{DELAY}$ by adjusting the threshold signal $S_{TH}$, providing more flexibility for the user in design.

Figure 4:
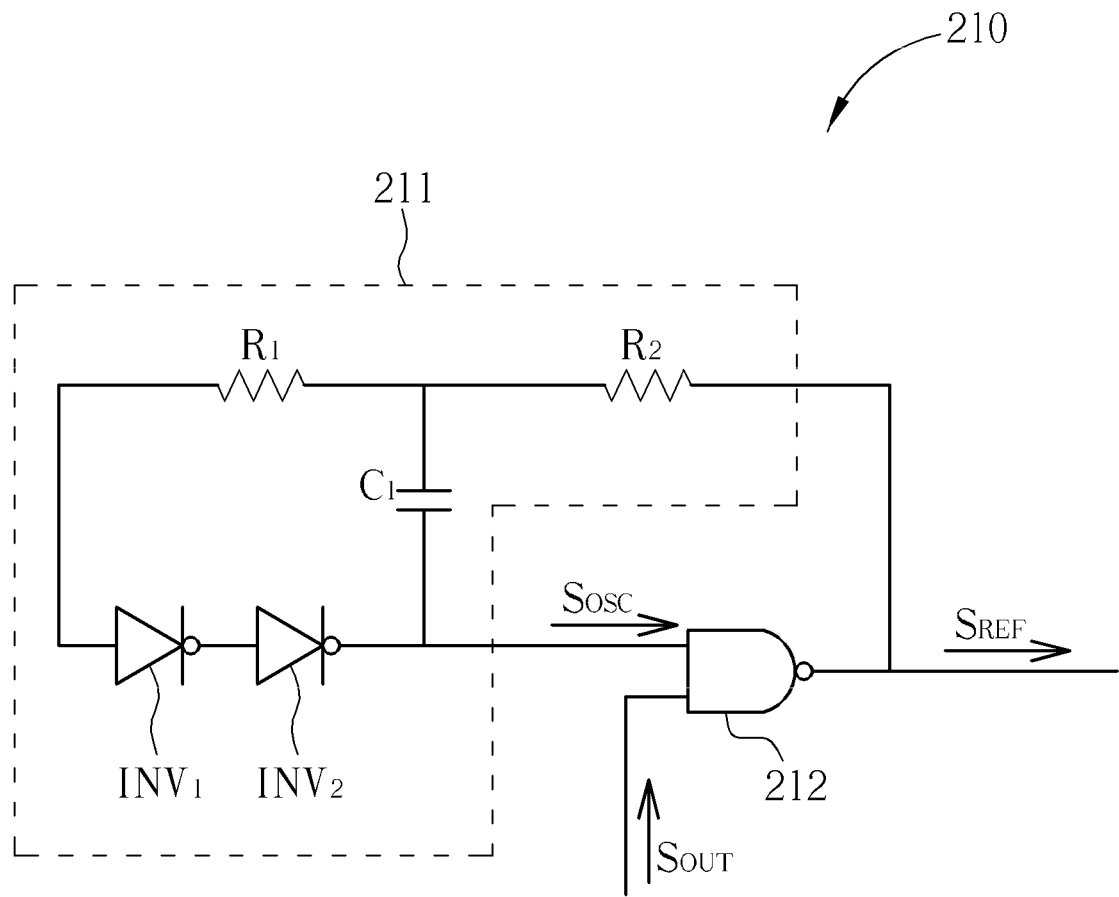
FIG. 4 is a diagram illustrating a clock signal generator according to an embodiment of the present invention.

Please refer to FIG. 4. FIG. 4 is a diagram illustrating the clock signal generator 210 according to an embodiment of the present invention. The clock signal generator 210 includes an oscillator (RC oscillator) 211, and a NAND gate 212. The oscillator 211 includes resistors $R_1$ and $R_2$, a capacitor $C_1$, and inverters $INV_1$ and $INV_2$. The oscillator 211 is utilized for generating an oscillating signal $S_{OSC}$. The cycle length of the oscillating signal $S_{OSC}$ is determined by the resistances of the resistors $R_1$ and $R_2$, and the capacitance of the capacitor $C_1$. The NAND gate 212 executes the logic operation according to the oscillating signal $S_{OSC}$ and the output signal $S_{OUT}$ so as to generate the reference clock signal $S_{REF}$. More particularly, when the output signal $S_{OUT}$ represents "enabling", the NAND gate outputs the oscillating signal $S_{OSC}$ of the oscillator 211 as the reference clock signal $S_{REF}$; otherwise, when the output signal $S_{OUT}$ represents "not enabling", the NAND gate 212 does not output the oscillator signal $S_{OSC}$ of the oscillator 211.

Figure 5:
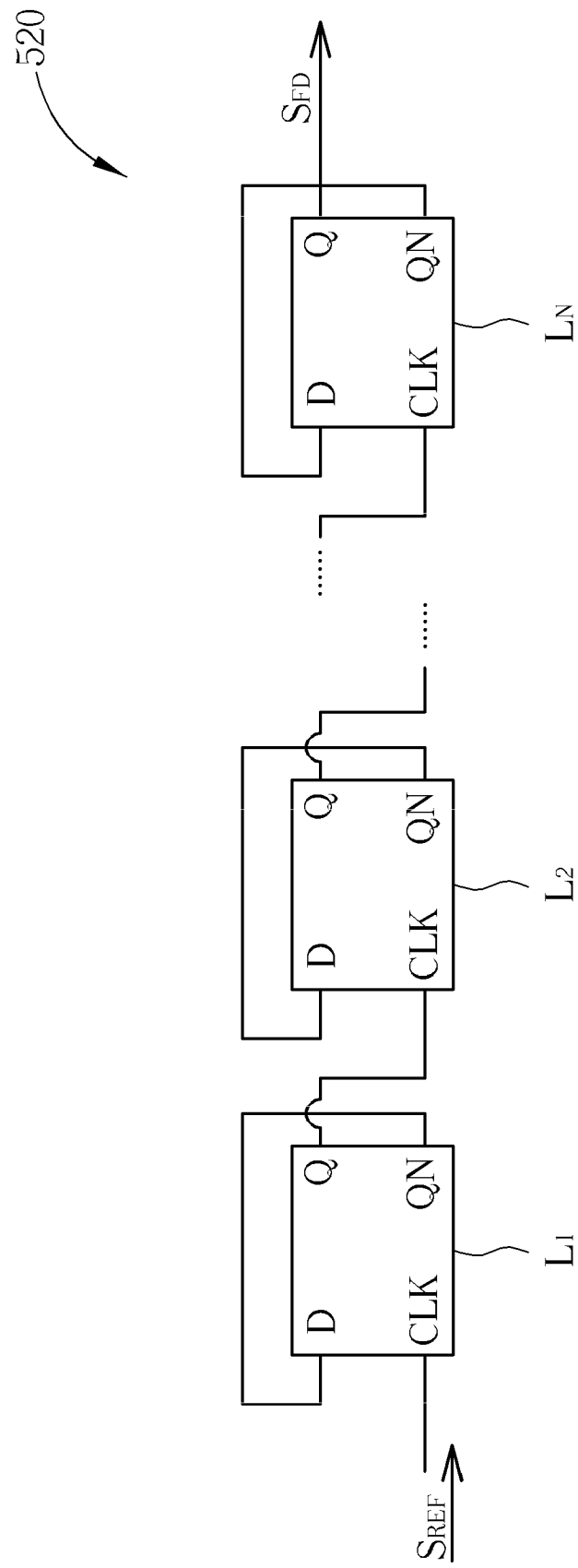
FIG. 5 is a diagram illustrating a first embodiment of the frequency-dividing circuit of the present invention.

Please refer to FIG. 5. FIG. 5 is a diagram illustrating a first embodiment 520 of the frequency-dividing circuit of the present invention. The frequency-dividing circuit 520 is used for realizing the frequency-dividing circuit 220 in FIG. 2. The frequency-dividing circuit 520 includes D-type latches $L_1 \sim L_N$. Each D-type latch includes an input end D, a clock end CLK, a positive output end Q, and a negative output end QN. The coupling relation among the D-type latches $L_1 \sim L_N$ is shown in FIG. 5. In the frequency-dividing circuit 520, the cycle length of the signal outputted by the positive output end Q of the D-type latch $L_1$ is twice as long as that of the reference clock signal $S_{REF}$; the cycle length of the signal outputted by the positive output end Q of the D-type latch $L_2$ is $2^2$ times as long as that of the reference clock signal $S_{REF}$ and so on. Consequently, the cycle length of the signal (that is, the frequency-dividing signal $S_{FD}$) outputted by the positive output end Q of the D-type latch $L_N$ is $2^N$ times as long as that of the reference clock signal $S_{REF}$. In other words, as long as the number (N) of the D-type latches of the frequency-dividing circuit 520 is increased, the frequency-dividing times of the frequency-dividing circuit 520 increases, so that the order of magnitude of the cycle length of the frequency-dividing signal $S_{FD}$ increases.

Figure 6:
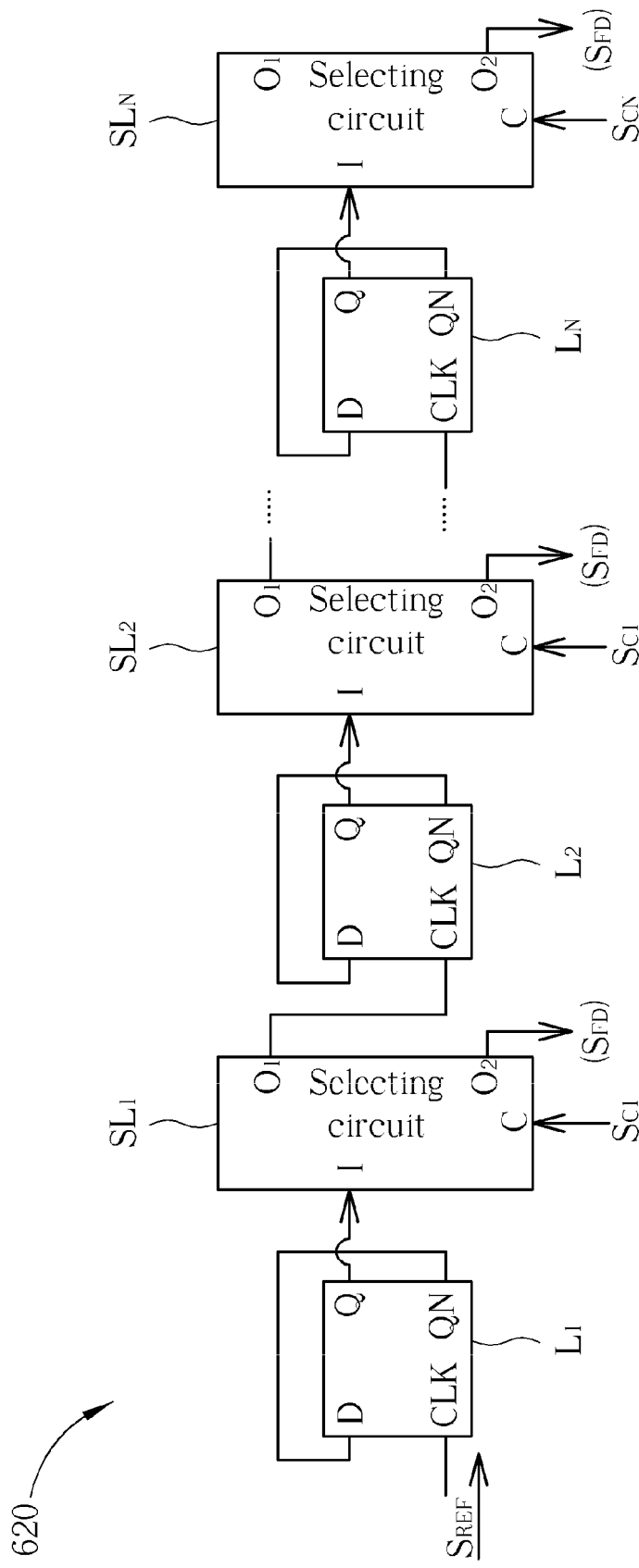
FIG. 6 is a diagram illustrating a second embodiment of the frequency-dividing circuit of the present invention.

Please refer to FIG. 6. FIG. 6 is a diagram illustrating a second embodiment 620 of the frequency-dividing circuit of the present invention. Compared with the frequency-dividing circuit 520, the frequency-dividing circuit 620 further includes selecting circuits $SL_1 \sim SL_N$. Each selecting circuit includes an input end I, output ends $O_1$ and $O_2$, and a control end C. The input ends I of the selecting circuits $SL_1 \sim SL_N$ are respectively coupled to the positive output ends Q of the D-type latches $L_1 \sim L_N$. The output ends $O_1$ of the selecting circuits $SL_1 \sim SL_{(N-1)}$ are respectively coupled to the clock ends CLK of the D-type latches $L_2 \sim L_N$. The output ends $O_2$ of the selecting circuits $SL_1 \sim SL_N$ are coupled to the counter 231 shown in FIG. 2. The control ends C of the selecting circuits $SL_1 \sim SL_N$ receive the control signals $S_{C1} \sim S_{CN}$, respectively. When the control signal $S_{CX}$ represents "clock", the input end I of the selecting circuit $SL_X$ is coupled to the output end $O_1$ of the selecting circuit $SL_X$; and when the control signal $S_{CX}$ represents "frequency-dividing", the input end I of the selecting circuit $SL_X$ is coupled to the output end $O_2$ of the selecting circuit $SL_X$. Consequently, when a control signal $S_{CH}$ of the control signals $S_{C1} \sim S_{CN}$ represents "frequency-dividing" and the other control signals represents "clock", the positive output end Q of the D-type latch $L_H$ is coupled to the counter 231 through the selecting circuit $SL_H$. In other words, the signal outputted by the positive output end Q of the D-type latch $L_H$ is utilized as the frequency-dividing signal $S_{FD}$ at the time. That is, the selecting circuits $S_{L1} \sim S_{LN}$ can select a D-type latch (for example, $L_H$) of the D-type latches $L_1 \sim L_N$ to output the frequency-dividing signal $S_{FD}$ according to the control signals $S_{C1} \sim S_{CN}$. Since the cycle length of the frequency-dividing signal $S_{FD}$ is $2^H$ times as long as the cycle length $T_{REF}$ of the reference clock signal $S_{REF}$, the delay period $T_{DELAY}$ of the one-shot circuit 200 can be represented by the following formula:

$$T_{DELAY} = 2^I \times T_{REF} \times S_{TH} \quad (2);$$

as a result, it can be seen according to formula (2) that the order of the magnitude of the period length of the delay period $T_{DELAY}$ can be dynamically adjusted by the control signals $S_{C1} \sim S_{CN}$ by means of design of the frequency-dividing circuit 620.

Figure 7:
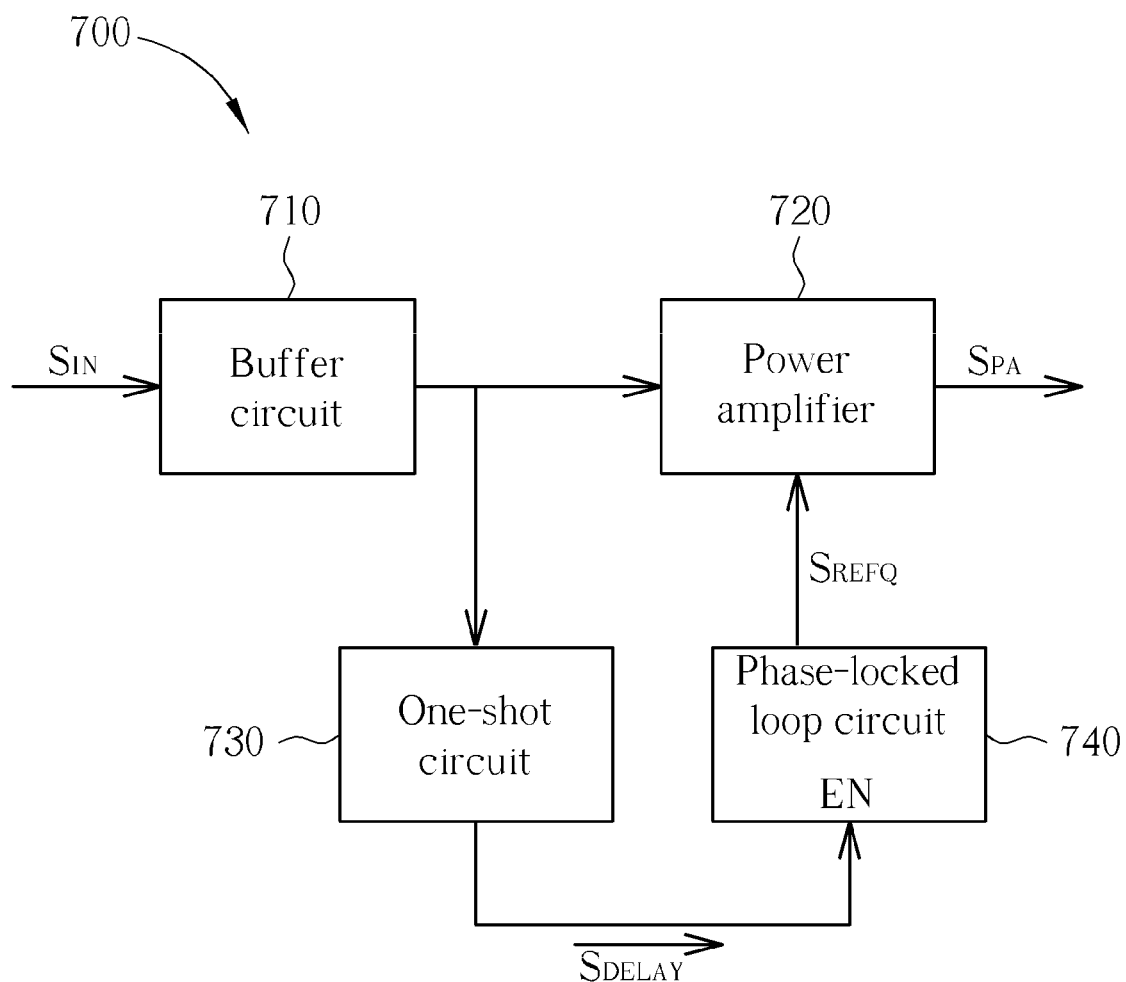
FIG. 7 is a diagram illustrating a transmitter according to an embodiment of the present invention.

Please refer to FIG. 7. FIG. 7 is a diagram illustrating a transmitter 700 according to an embodiment of the present invention. The transmitter 700 is utilized for generating an amplified signal $S_{PA}$ according to an input signal $S_{IN}$. For example, the transmitter 700 may be a remote control. The user can send input signal $S_{IN}$ through the remote control. The transmitter 700 includes a buffer circuit 710, a power amplifier 720, a one-shot circuit 730, and a phase-locked loop circuit 740. The buffer circuit 710 is utilized for trimming the waveform of the input signal $S_{IN}$. The one-shot circuit 730 is realized by the one-shot circuit according to the embodiment of the present invention (such as the one-shot circuit 200). The phase-locked loop circuit 740 is utilized for generating a reference frequency signal $S_{REFQ}$. For instance, if the frequency of the signal transmitted by the transmitter 700 is 900 MHz, the phase-locked loop circuit 740 has to generate a reference frequency signal $S_{REFQ}$ of 900 MHz to send to the power amplifier 720. In the transmitter 700 of the present invention, the delay signal $S_{DELAY}$ generated by the one-shot circuit 730 controls the phase-locked loop circuit 740. When the delay signal $S_{DELAY}$ represents "enabling", the phase-locked loop circuit 740 generates the reference frequency signal $S_{REFQ}$; and when the delay signal $S_{DELAY}$ represents "not enabling", the phase-locked loop circuit 740 does not generate the reference frequency signal $S_{REFQ}$. The power amplifier 720 generates the amplified signal $S_{PA}$ according to the input signal $S_{IN}$ and the reference frequency signal $S_{REFQ}$.

In the prior art, the phase locked loop circuit of the conventional transmitter is controlled by the input signal $S_{IN}$. For instance, when the input signal $S_{IN}$ represents "enabling", the phase-locked loop circuit generates the reference frequency signal $S_{REFQ}$; and when the input signal $S_{IN}$ represents "not enabling", the phase-locked loop circuit does not generate the reference frequency signal $S_{REFQ}$. However, when the phase-locked loop circuit generates the reference frequency signal $S_{REFQ}$, a phase-locked period is required for the phase-locked loop circuit to lock the frequency. Thus, when the user sends signals sporadically through the conventional transmitter, the conventional transmitter has to wait until the phase-locked loop circuit re-locks the frequency again for transmitting signals. In the transmitter 700 of the present invention, the shut-down timing (sleep timing) of the phase-locked loop is delayed by the delay signal $S_{DELAY}$. For instance, when the input signal $S_{IN}$ changes from representing "enabling" to "not enabling", the delay signal $S_{DELAY}$ generated by the one-shot circuit 730 continues to represent "enabling" for a delay period $T_{DELAY}$, so that the phase-locked loop circuit 740 continues to generate reference frequency signal $S_{REFQ}$ in the delay period $T_{DELAY}$. In other words, when the user send signals sporadically through the transmitter 700 of the present invention, the input signal $S_{IN}$ continuously triggers the one-shot circuit 730 again and again, so that the period of the delay period $S_{DELAY}$ representing "enabling" is continuously extended. In this way, the phase-locked loop circuit 740 remains in the phase-locked state. Hence, the transmitter 700 can directly transmit signals. That is, the start-up time of the transmitter 700 is reduced by means of the delay signal $S_{DELAY}$ of the one-shot circuit 730 delaying the shut-down timing (sleep timing) of the phase-locked loop circuit 740.

Figure 8:
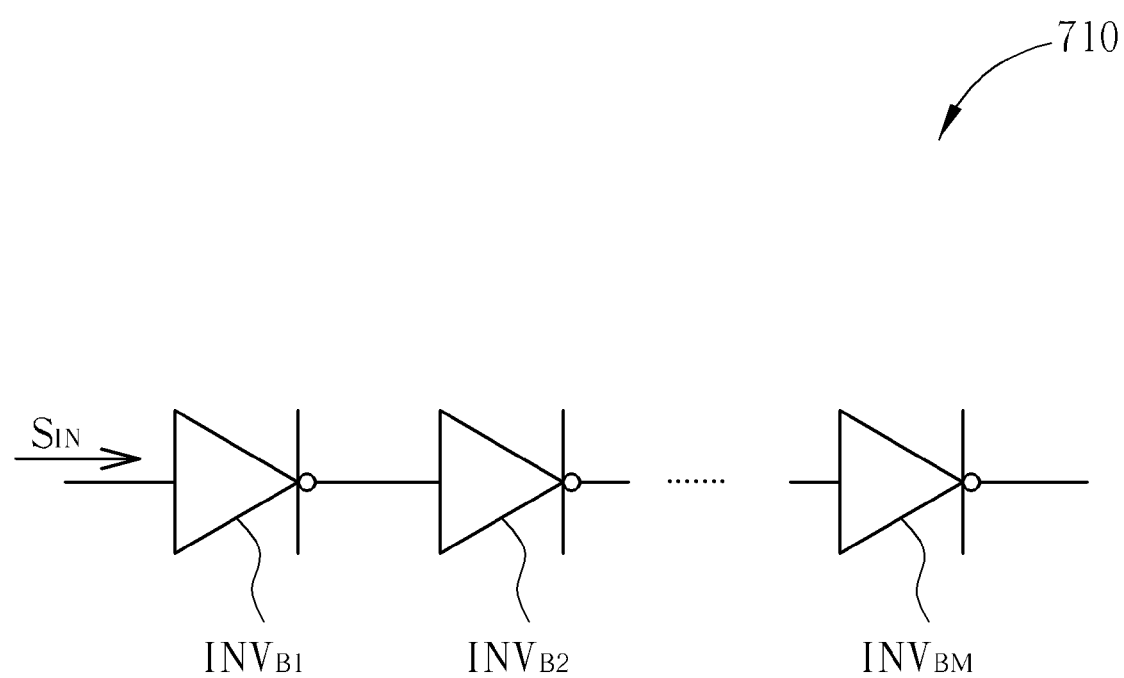
FIG. 8 is a diagram illustrating a buffer circuit according to an embodiment of the present invention.

Please refer to FIG. 8. FIG. 8 is a diagram illustrated a buffer circuit 710 of the present invention. The buffer circuit 710 includes inverters $INV_{B1} \sim INV_{BM}$, wherein M represents an even integer.

In conclusion, the present invention provides a one-shot circuit capable of being integrated into a chip. In the one-shot circuit of the present invention, the frequency-dividing circuit generates the frequency-dividing signal according to the reference clock signal of the clock signal generator. When the input signal changes from representing "enabling" to "not enabling", the input signal triggers the counter to reset the counting value. The counter accumulates the counting value according to the frequency-dividing signal, and compares the counting value with a threshold signal so as to generate the output signal. The logic circuit generates the delay signal according to the output signal and the input signal. In this way, by means of increasing the frequency-dividing times of the frequency-dividing circuit so as to increase the order of the magnitude of the cycle length of the frequency-dividing signal, the required resistance and capacitance of the oscillators of the clock signal generator are effectively reduced, so that the one-shot circuit can be integrated into a chip. In addition, the present invention further provides a transmitter. The transmitter of the present invention controls the phase-locked loop circuit generating the reference frequency signal by means of the delay signal outputted by the one-shot circuit. In other words, the transmitter of the present invention can delay the shut-down timing (sleep timing) of the phase-locked loop circuit by means of the delay signal outputted by the one-shot circuit. In this way, the phase-locked loop circuit is controlled to remain in the phase-locked state in the delay period, so that the start-up time of the transmitter transmitting signals is reduced, providing a great convenience.

Those skilled in the art will readily observe that numerous modifications and alterations of the device and method may be made while retaining the teachings of the invention.

What is claimed is:

1. A one-shot circuit capable of being integrated into a chip, comprising:
a clock signal generator for generating a reference clock signal according to an output signal, wherein when the output signal represents enabling, the clock signal generator generates the reference clock signal;
a frequency-dividing circuit for generating a frequency-dividing signal according to the reference clock signal; and
a counter for accumulating a counting value according to an input signal and the frequency-dividing signal, and comparing the counting value with a threshold signal to generate the output signal.

2. The one-shot circuit of claim 1, wherein the clock signal generator includes:
an oscillator for generating an oscillating signal; and
a NAND gate for executing logic operation according to the oscillating signal and the output signal;
wherein the oscillator is a phase-shifting circuit.

3. The one-shot circuit of claim 1, wherein the frequency-dividing circuit includes:
N-number D-type latches, wherein the each D-type latch has an input end, a clock end, a positive output end, and a negative output end;
wherein a clock end of a first D-type latch of all the D-type latches is utilized for receiving the reference clock signal; a negative output end of the first D-type latch is coupled to an input end of the first D-type latch; and a positive output end of the first D-type latch is coupled to a clock end of a second D-type latch of the D-type latches;
wherein a clock end of a $K^{th}$ D-type latch of the D-type latches is coupled to a positive output end of a $(K-1)^{th}$ D-type latch of the D-type latches; an input end of the $K^{th}$ D-type latch is coupled to a negative output end of the $K^{th}$ D-type latch; and a positive output end of $K^{th}$ D-type latch is coupled to a clock end of a $(K+1)^{th}$ D-type latch of the D-type latches;
wherein both N and K belong to a set of positive integers, and $2 \leq K \leq (N-1)$;
wherein an input end of the $N^{th}$ D-type latch is coupled to a negative output end of the $N^{th}$ D-type latch; and a positive output end of the $N^{th}$ D-type latch is utilized for outputting the frequency-dividing signal.

4. The one-shot circuit of claim 3, wherein the frequency-dividing circuit further includes:
N-number selecting circuits for selecting an $H^{th}$ D-type latch from the N-number D-type latches to output the frequency-dividing signal according to N-number control signals, H representing a positive integer, and $1 \leq H \leq N$;
wherein when an $H^{th}$ control signal of the N-number control signals represents frequency dividing process, a signal outputted by a positive end of the $H^{th}$ D-type latch of the N-number D-type latches is transmitted to the counter as the frequency-dividing signal;
wherein a period of the counter accumulating the counting value up to the threshold signal represents a delay period, and the delay period is represented by the following formula:

$$T_{DELAY} = 2^H \times T_{REF} \times S_{TH};$$

wherein $T_{DELAY}$ represents the delay period; $T_{REF}$ represents cycle length of the reference clock signal; and $S_{TH}$ represents the threshold signal.

5. The one-shot circuit of claim 1, wherein when the input signal changes from representing enabling to not enabling, the input signal triggers the counter to reset the counting value and urges the counter to accumulate the counting value according to the frequency-dividing signal;
wherein when the counting value is less than the threshold signal, the input signal represents enabling; and when the counting value is greater than or equal to the threshold signal, the input signal represents not enabling.

6. The one-shot circuit of claim 5, further comprising:
a logic circuit for receiving the input signal and the output signal to generate a delay signal;
wherein when the input signal represents enabling, the delay signal represents enabling; when the output signal represents enabling, the delay signal represents enabling; and when the input signal and the output signal both represent not enabling, the delay signal represents not enabling.

7. The one-shot circuit of claim 6, wherein a period of the counter accumulating the counting value up to the threshold signal is a delay period; cycle length of the frequency-dividing signal is N times cycle length of the reference period signal; N represents a positive integer; and the delay period is represented by the following formula:

$$T_{DELAY} = 2^N \times T_{REF} \times S_{TH};$$

wherein $T_{DELAY}$ represents the delay period; $T_{REF}$ represents cycle length of the reference clock signal; and $S_{TH}$ represents the threshold signal.

8. A transmitter for reducing start-up time, which transmits an amplified signal according to an input signal, the transmitter comprising:
a phase-locked loop circuit for generating a reference frequency signal according to a delay signal, wherein when the delay signal represents enabling, the phase-locked loop circuit generates the reference frequency signal;
a power amplifier for generating the amplified signal according to the input signal and the reference frequency signal; and
a one-shot circuit for generating the delay signal according to the input signal;
wherein when the input signal changes from representing enabling to not enabling, the delay signal generated by the one-shot circuit continues to represent enabling for a delay period, so that the phase-locked loop circuit continues to generate the reference frequency signal in the delay period.

9. The transmitter of claim 8, wherein the one-shot circuit comprises:
a clock signal generator for generating a reference clock signal according to an output signal, wherein when the output signal represents enabling, the clock signal generator generates the reference clock signal;
a frequency-dividing circuit for generating a frequency-dividing signal according to the reference clock signal; and
a counter for accumulating a counting value according the an input signal and the frequency-dividing signal, and comparing the counting value with a threshold signal to generate the output signal.

10. The transmitter of claim 9, wherein the clock signal generator includes:
an oscillator for generating an oscillating signal; and a NAND gate for executing logic operation according to the oscillating signal and the output signal;

wherein the oscillator is a phase-shifting circuit.

11. The transmitter of claim 9, wherein the frequency-dividing circuit includes:

N-number D-type latches, wherein the each D-type latch has an input end, a clock end, a positive output end, and a negative output end;

wherein a clock end of a first D-type latch of all the D-type latches is utilized for receiving the reference clock signal; a negative output end of the first D-type latch is coupled to an input end of the first D-type latch; and a positive output end of the first D-type latch is coupled to a clock end of a second D-type latch of the D-type latches;

wherein a clock end of a $K^{th}$ D-type latch of the D-type latches is coupled to a positive output end of a $(K-1)^{th}$ D-type latch of the D-type latches; an input end of the $K^{th}$ D-type latch is coupled to a negative output end of the $K^{th}$ D-type latch; and a positive output end of $K^{th}$ D-type latch is coupled to a clock end of a $(K+1)^{th}$ D-type latch of the D-type latches;

wherein both N and K belong to a set of positive integers, and $2 \leq K \leq (N-1)$;

wherein an input end of the $N^{th}$ D-type latch is coupled to a negative output end of the $N^{th}$ D-type latch; and a positive output end of the $N^{th}$ D-type latch is utilized for outputting the frequency-dividing signal.

12. The transmitter of claim 11, wherein the frequency-dividing circuit further includes:

N-number selecting circuits for selecting an $H^{th}$ D-type latch from the N-number D-type latches to output the frequency-dividing signal according to N-number control signals, H representing a positive integer, and $1 \leq H \leq N$;

wherein when an $H^{th}$ control signal of the N-number control signals represents frequency dividing process, a signal outputted by a positive end of the $H^{th}$ D-type latch of the N-number D-type latches is transmitted to the counter as the frequency-dividing signal;

wherein a period of the counter accumulating the counting value up to the threshold signal represents a delay period, and the delay period is represented by the following formula:

$T_{DELAY} = 2^H \times T_{REF} \times S_{TH}$;

wherein $T_{DELAY}$ represents the delay period; $T_{REF}$ represents cycle length of the reference clock signal; and $S_{TH}$ represents the threshold signal.

13. The transmitter of claim 9, wherein when the input signal changes from representing enabling to not enabling, the input signal triggers the counter to reset the counting value and urges the counter to accumulate the counting value according to the frequency-dividing signal;

wherein when the counting value is less than the threshold signal, the input signal represents enabling; and when the counting value is greater than or equal to the threshold signal, the input signal represents not enabling.

14. The transmitter of claim 13, further comprising:

a logic circuit for receiving the input signal and the output signal to generate a delay signal;

wherein when the input signal represents enabling, the delay signal represents enabling; when the output signal represents enabling, the delay signal represents enabling; and when the input signal and the output signal both represent not enabling, the delay signal represents not enabling.

15. The transmitter of claim 14, wherein a period of the counter accumulating the counting value up to the threshold signal is a delay period; cycle length of the frequency-dividing signal is N times cycle length of the reference period signal; N represents a positive integer; and the delay period is represented by the following formula:

$T_{DELAY} = 2^N \times T_{REF} \times S_{TH}$;

wherein $T_{DELAY}$ represents the delay period; $T_{REF}$ represents cycle length of the reference clock signal; and $S_{TH}$ represents the threshold signal.

16. The transmitter of claim 8, further comprising:

a buffer circuit for trimming a waveform of the input signal, the buffer circuit comprising M inverters connected in series;

wherein M represents an even integer.

17. A method of saving start-up time of a transmitter, the transmitter utilized for transmitting an amplified signal according to an input signal, the transmitter having a phase-locked loop and a power amplifier, the phase-locked loop circuit utilized for generating a reference frequency signal, the power amplifier utilized for generating the amplified signal according to the input signal and the reference frequency signal, the method comprising:

providing a one-shot circuit;

generating a delay signal by the one-short circuit according to the input signal; and controlling the phase-locked loop circuit to generate the reference frequency signal according to the delay signal.

18. The method of claim 17, wherein the controlling step includes:

the phase-locked loop circuit generating the reference frequency signal when the delay signal represents enabling;

wherein the one-shot circuit generating the delay signal according to the input signal comprises:

generating the delay signal representing enabling when the input signal represents enabling; and the delay signal continuing to represent enabling for a delay period when the input signal changes from representing enabling to not enabling for the phase-locked loop to continue generating the reference frequency signal in the delay period.

* * * * *